United States Patent
Vandermey et al.

(10) Patent No.: US 9,437,409 B2
(45) Date of Patent: Sep. 6, 2016

(54) HIGH VOLTAGE POWER SUPPLY FILTER FOR A MASS SPECTROMETER

(71) Applicant: DH Technologies Development Pte. Ltd., Singapore (SG)

(72) Inventors: John Vandermey, Georgetown (CA); Alexander Tsipirovich, Toronto (CA)

(73) Assignee: DH Technologies Development Pte. Ltd., Singapore (SG)

( * ) Notice: Subject to any disclaimer, the term of this patent is extended or adjusted under 35 U.S.C. 154(b) by 91 days.

(21) Appl. No.: 14/367,229

(22) PCT Filed: Dec. 6, 2012

(86) PCT No.: PCT/IB2012/002630
§ 371 (c)(1),
(2) Date: Jun. 19, 2014

(87) PCT Pub. No.: WO2013/098615
PCT Pub. Date: Jul. 4, 2013

(65) Prior Publication Data
US 2015/0187552 A1    Jul. 2, 2015

Related U.S. Application Data

(60) Provisional application No. 61/580,418, filed on Dec. 27, 2011.

(51) Int. Cl.
| | |
|---|---|
| *H02M 7/10* | (2006.01) |
| *H03H 7/01* | (2006.01) |
| *H03H 11/04* | (2006.01) |
| *H01J 49/02* | (2006.01) |
| *G05F 3/16* | (2006.01) |
| *H01J 49/06* | (2006.01) |
| *H01J 49/26* | (2006.01) |

(52) U.S. Cl.
CPC ............... *H01J 49/022* (2013.01); *G05F 3/16* (2013.01); *H01J 49/025* (2013.01); *H01J 49/067* (2013.01); *H01J 49/26* (2013.01); *H03H 7/0138* (2013.01); *H03H 11/04* (2013.01)

(58) Field of Classification Search
CPC .......................... H01J 49/022; H02M 7/103
See application file for complete search history.

(56) References Cited

U.S. PATENT DOCUMENTS

| | | | |
|---|---|---|---|
| 4,994,774 A | 2/1991 | Joose | |
| 5,734,163 A * | 3/1998 | Hayashi | H01J 49/4215 250/282 |
| 6,407,382 B1 | 6/2002 | Spangler | |
| 2006/0138545 A1* | 6/2006 | Kuo | H02H 11/006 257/355 |
| 2008/0067354 A1* | 3/2008 | Gabeler | H01J 49/022 250/288 |
| 2009/0230297 A1 | 9/2009 | Mizutani | |
| 2011/0084690 A1 | 4/2011 | Vandermey | |
| 2011/0101218 A1 | 5/2011 | Makarov | |

OTHER PUBLICATIONS

International Search Report from International Patent Application No. PCT/IB2012/002630, May 1, 2013.

* cited by examiner

*Primary Examiner* — Robert Kim
*Assistant Examiner* — Sean Luck

(57) ABSTRACT

Systems, devices, circuits, and methods are provided for an improved mass spectrometry detection system that comprises at least one component that operates at a high voltage. A number of high voltage filters or circuits are provided for reducing noise from high voltage power supplies that produce positive and negative voltages. In some embodiments, the filters can comprise one or more diodes. In some embodiments, the filters can comprise one or more transistors. In some embodiments, the filters can comprise one or more transistor pairs. A variety of embodiments of systems, devices, circuits, and methods in conjunction with the disclosures are provided.

10 Claims, 8 Drawing Sheets

HIGH VOLTAGE POWER SUPPLY FILTER FOR A MASS SPECTROMETER

RELATED APPLICATION

This application claims the benefit and priority of U.S. Provisional Application Ser. No. 61/580,418, filed on Dec. 27, 2011, the entire contents of which is hereby incorporated by reference herein.

FIELD

Applicant's teaching are directed to high voltage power supplies.

INTRODUCTION

The disclosure relates to systems, devices, circuits, and methods for operating a mass spectrometry detection system. Typically, high voltages (in the range of about ±2 kV to about ±8 kV) used to power components of a mass spectrometry detection system result in undesirable noise levels that can affect the resolution and accuracy of the system. The resolution of a mass spectrometry detection system can be limited by a number of different parameters, including, for example, the long and short term stability of any power supplies associated with the system. High frequency voltage variations can lead to peak widening and loss of resolution, while slow changes that can result from switching power supplies can result in a mass shift and the need to recalibrate the instrument more often.

Conventional techniques used to filter the noise from high voltage power supplies are limited. For example, when a simple RC filter is used, it is generally preferred to keep a capacitance low, however, doing so conflicts with the degree of filtering. Increasing the resistance of resistors of the RC filter typically results in increased charging times. By way of further example, when conventional active filters are used, such as those that comprise a non-inverting amplifier with unity gain, multiple power supplies are often floated between positive and negative voltages to drive the circuit, leading to additional noise and negatively impacting resolution.

Still further, the use of multiple high voltage power supplies to drive the mass spectrometry detection system can make it difficult to protect the system from any high voltages that appear across the system in power-up or fault conditions. Accordingly, improved detection systems, devices, circuits and methods for filtering detection systems are desired.

SUMMARY

The following summary is intended to introduce the reader to this specification but not to define any invention. One or more inventions may reside in a combination or sub-combination of the system and/or device elements or the method steps described below or in other parts herein. The inventors do not waive or disclaim their rights to any invention or inventions disclosed in this specification merely by not describing such other invention or inventions in the claims.

The embodiments described herein provide, in some aspects, a mass spectrometer system comprising an ion analyzer, a high voltage power supply, and a high voltage filter. The high voltage power supply can be electrically coupled to the analyzer, and the high voltage filter can be electrically coupled to the high voltage power supply. Further, the high voltage filter can be configured to both reduce noise from a high positive voltage that is outputted by the high voltage power supply and reduce noise from a high negative voltage outputted by the high voltage power supply. In some embodiments, the high voltage filter can comprise one or more diodes that are configured to filter noise from a voltage outputted by the high voltage power supply before the voltage arrives at an output of the analyzer. In some embodiments, the one or more diodes can comprise a first diode and a second diode that are electrically coupled in parallel and disposed in opposite directions to each other. In some embodiments, the high voltage filter can comprise at least one transistor configured to filter noise from a voltage outputted by the high voltage power supply before the voltage arrives at an output of the analyzer. In some embodiments, the at least one transistor can comprise a first transistor and a second transistor that are electrically coupled in parallel. In some embodiments, the at least one transistor can comprise at least two transistor pairs that are electrically coupled in parallel, with each pair comprising a Darlington transistor. In some embodiments, the high voltage power supply can be the only power supply that is electrically coupled to the analyzer. In some embodiments, the analyzer can comprise at least one of a lens, an accelerator, a liner, a reflector, and one or more multi-channel plate detectors, and the high voltage power supply can be electrically coupled to at least one of the lens, the accelerator, the liner, the reflector, and the one or more multi-channel plate detectors. In some embodiments, the mass spectrometer system can further comprise an ion source and a mass analyzer configured to receive a plurality of ions, from the ion source. In some embodiments, the mass analyzer can be disposed upstream from the ion analyzer and can be configured to discharge ions to the ion analyzer.

The embodiments described herein provide, in further aspects, a circuit for use with a high voltage power supply of a mass spectrometer system comprising a high voltage input, a high voltage output, a diode electrically coupled between the high voltage input and the high voltage output, and a capacitor electrically coupled to the diode. The diode can be configured to filter noise from a voltage outputted by the high voltage input before the voltage arrives at the high voltage output. In some embodiments, the diode can be configured to automatically adjust to achieve a desired output voltage at the high voltage output. In some embodiments, the circuit can further comprise a second diode electrically coupled to the diode in parallel, disposed in a direction opposite to a direction of the diode, and configured to filter noise from a voltage outputted by the high voltage input before the voltage arrives at the high voltage output. In some embodiments, the first diode and the second diode can be configured to automatically adjust to achieve a desired output voltage at the high voltage output. In some embodiments, the high voltage input can be the only power supply associated with the circuit. In some embodiments, the high voltage output can be applied to a lens either proximate to or in an ion analyzer of a mass spectrometer.

The embodiments described herein provide, in further aspects, a circuit for use with a high voltage power supply of a mass spectrometer system comprising a high voltage input, a high voltage output, a low pass filter coupled between the high voltage input and the high voltage output, and at least one transistor coupled between the high voltage input and the high voltage output, downstream of the low pass filter. The low pass filter can be configured to prevent frequencies higher than a threshold frequency from passing to the high voltage output. The at least one transistor can be configured to filter noise from a voltage outputted by the high voltage input before the voltage arrives at the high voltage output. In some embodiments, the at least one transistor can comprise an emitter follower transistor. In some embodiments, the at least one transistor can comprise at least two transistors that are electrically coupled in parallel. In some embodiments, a first transistor can comprise an npn transistor and a second transistor can comprise a pnp transistor. In some embodiments, the at least one transistor can comprise at least two transistor pairs that are electrically coupled in parallel, with each pair comprising a Darlington transistor. In some embodiments, a first transistor pair can comprise at least two npn transistors and a second transistor pair can comprise at least two pnp transistors. In some embodiments, the low pass filter can comprise at least one resistor and at least one capacitor. In some embodiments, the low pass filter can comprise a second order low pass filter such that the at least one resistor comprises at least two resistors and the at least one capacitor comprises at least two capacitors. In some embodiments, the circuit can further comprise a Zener diode pair electrically coupled in parallel with the at least one transistor. In some embodiments, the circuit can further comprise a resistor disposed downstream of the at least one transistor. In some embodiments, the high voltage input can be the only power supply associated with the circuit. In some embodiments, the high voltage output can be applied to at least one of a lens, an accelerator, a liner, a reflector, and one or more multi-channel plate detectors.

The embodiments described herein provide, in yet further aspects, in a mass spectrometer, a method for detecting ions comprising introducing a plurality of ions into an ion analyzer of a mass spectrometer to generate a current signal indicative of at least one parameter of the ions, applying a positive high voltage to the analyzer from a power source, applying a negative high voltage to the analyzer from the power source, using a filter to remove noise from the positive high voltage, using a filter to remove noise from the negative high voltage, detecting at least one parameter of the ions based on a signal outputted by the filter for the positive high voltage, and detecting at least one parameter of the ions based on a signal outputted by the filter for the negative high voltage. In some embodiments, the filter can comprise one or more diodes. In some embodiments, the one or more diodes can comprise a first diode and a second diode coupled in parallel and disposed in opposite directions to each other. In some embodiments, the filter can comprise at least one transistor. In some embodiments, the at least one transistor can comprise a first transistor and a second transistor electrically coupled in parallel. In some embodiments, the at least one transistor can comprise at least two transistor pairs electrically coupled in parallel, with each pair comprising a Darlington transistor. In some embodiments, the ion analyzer can comprise a time-of-flight analyzer. In some such embodiments, the steps of applying a positive high voltage to the analyzer and applying a negative high voltage to the analyzer can further comprise applying a positive high voltage to at least one of a lens, an accelerator, an electrode, a liner, a reflector, and one or more multi-channel plate detectors, and applying a negative high voltage to at least one of a lens, an accelerator, an electrode, a liner, a reflector, and one or more multi-channel plate detectors.

These and other features of the applicants' teachings are set forth herein.

BRIEF DESCRIPTION OF DRAWINGS

The skilled person in the art will understand that the drawings, described below, are for illustration purposes only. The drawings are not intended to limit the scope of the applicants' teachings in any way. This invention will be more fully understood from the following description of various embodiments taken in conjunction with the accompanying drawings, in which.

DESCRIPTION OF VARIOUS EMBODIMENTS

Certain exemplary embodiments will now be described to provide an overall understanding of the principles of the structure, function, manufacture, and use of the systems, devices, circuits, and methods disclosed herein. One or more examples of these embodiments are illustrated in the accompanying drawings. Those skilled in the art will understand that the systems, devices, circuits, and methods specifically described herein and illustrated in the accompanying drawings are non-limiting exemplary embodiments and that the scope of the present invention is defined solely by the claims. The features illustrated or described in connection with one exemplary embodiment may be combined with the features of other embodiments. Such modifications and variations are intended to be included within the scope of the systems, devices, circuits, and methods described herein.

Figure 1:
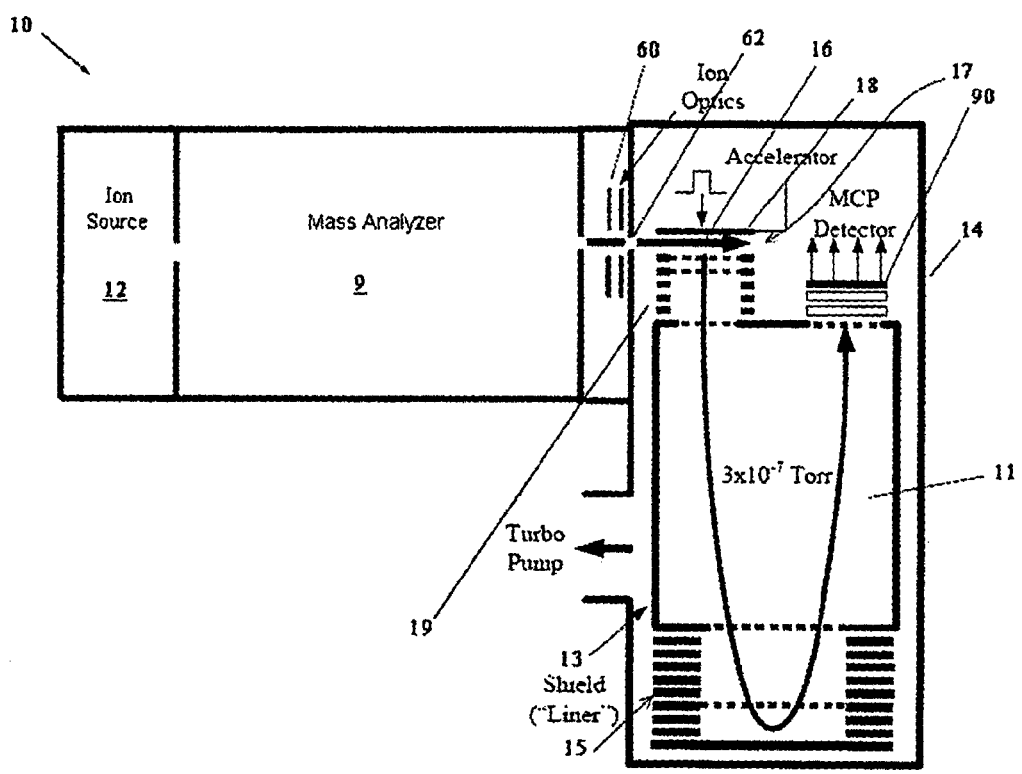
FIG. 1 is a schematic representation of a mass spectrometer in accordance with some embodiments of the applicants' teachings.

While the systems, devices, circuits, and methods described herein can be used in conjunction with many different mass spectrometry systems, a general diagram of a mass spectrometry system is illustrated in FIG. 1 to provide a general framework for describing various embodiments of the applicants' teachings. A more detailed description of various ways in which a mass spectrometer can be configured and operated in accordance with the applicants' teachings is provided later in this description. As shown, in some embodiments, a mass spectrometer 10 can comprise an ion source 12, an ion analyzer 14, and a mass analyzer 9 located upstream of the analyzer 14. The ion source 12 can emit ions that pass through the mass analyzer 9, which allows the passage of certain of those ions, e.g., ions having a mass-to-charge ratio (m/z ratio) in a selected range, through one or more lenses 60 and an input 62, and to the analyzer 14.

The analyzer 14 can be operated in a number of different manners to further differentiate the ions based on their distinct mass-to-charge ratios. In some embodiments, the analyzer 14 can comprise a time-of-flight (TOF) analyzer. Some TOF analyzers can comprise an ion detection module for mass separation of ions within the analyzer and one or more multi-channel plate (MCP) detectors for detecting the ions after they arrive from the ion detection module. A number of different parameters can be detected by the analyzer 14. By way of non-limiting example, in some embodiments in which the analyzer comprises a TOF analyzer, the analyzer 14 can measure a time it takes the ions to travel through a field-drift chamber 11, which can be indicative of a mass-to-charge ratio (m/z ratio) of the ions. Typically ions having higher m/z ratios take longer to travel through the field-drift chamber 11.

While various methods for operating analyzers are described further below, for purposes of discussing applicants' teachings, it is noted that a number of different components of the analyzer 14 can be powered by a high voltage power supply or input. The one or more lenses 60, which in some embodiments can be part of the analyzer itself, and a number of components of the analyzer 14 can be powered by a high voltage power supply. These components of the analyzer 14 comprise, but are not limited to: an accelerator or accelerator assembly 17, one or more electrodes 18 and/or guard rings 19, one or more shields or liners 13 disposed around at least a portion of the field-drift chamber 11, one or more ion reflectors or mirrors 15, and one or more MCP detectors 90. A person skilled in the art would understand a number of different manners which the aforementioned components of the analyzer 14, as well as other components not explicitly mentioned herein, can be used in association with applicants' teachings. A more detailed description of how these components interact is also provided later in this description.

The high voltage that is supplied to the various components of the analyzer 14 can be filtered in a variety of ways in accordance with applicants' teachings. More particularly, applicants have developed a number of different circuits that can be used as a filter to remove noise from the high voltage before the voltage reaches its destination component(s). By removing noise, the resolution, efficiency, and accuracy of the system can be improved.

Figure 2:
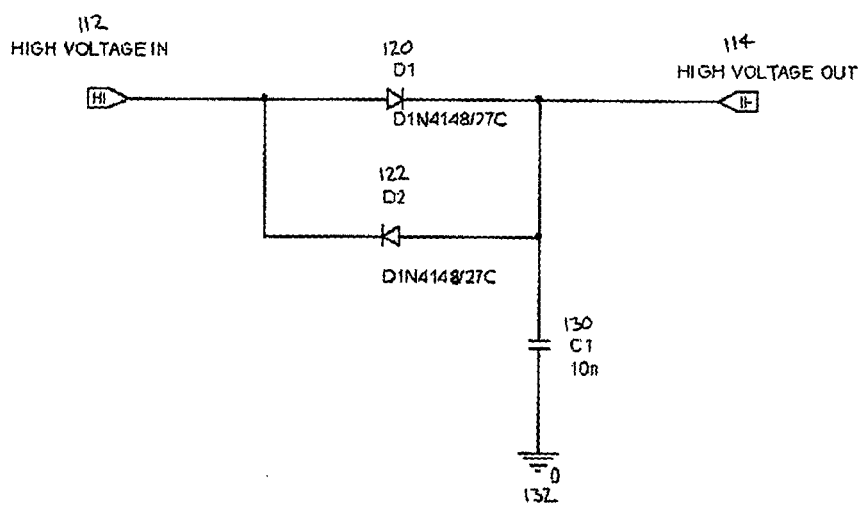
FIG. 2 is a schematic representation of a circuit according to some embodiments of the applicants' teachings.

FIG. 2 illustrates a filter or circuit 110 according to some embodiments of the applicants' teachings. The filter 110 comprises one or more diodes, as shown two diodes 120 and 122, electrically coupled to a capacitor 130. As shown, the capacitor 130 can be coupled to ground 132 at its other end. The one or more diodes 120, 122 and the capacitor 130 can be applied to filter noise from a high voltage input 112 before voltage supplied by the input 112 reaches a high voltage output 114. In various embodiments, two diodes 120, 122 can be wired in parallel and placed in opposite directions to each other. By placing the diodes 120, 122 in opposite directions, the circuit 110 can filter both polarities, i.e., both a positive high voltage and a negative high voltage, without requiring two separate power supplies each having a different polarity or having to float voltages of power supplies. As shown, the diodes 120, 122 are D1N4148/27C diodes, although a number of other diodes can be used depending, at least in part, on the other components of the circuit and the desired input and output parameters.

In some embodiments, a capacitance of the capacitor 130 can be kept low, for instance in the range of about 0.001 µF to about 0.1 µF. In the schematic representation provided in FIG. 2, the capacitor 130 has a capacitance value of about 0.01 µF. A person skilled in the art will recognize that a capacitor having a low capacitance value will result in a lower degree of filtering. The at least one diode, however, can provide a non-linear, dynamic resistance that can enhance the effectiveness of the filter with respect to the high voltage. A dynamic resistance of the at least one diode can be represented by the equation:

$$R = \frac{.025}{I}, \quad \text{(Equation 1)}$$

where R is the dynamic resistance of the at least one diode and I is the current through the at least one diode generated by the applied high voltage. As power is applied to the filter 110, the current of high voltage signal can be large during charging the capacitor 130, but the time to charge the capacitor 130 can be small because of the dynamic resistance provided by the at least one diode. When the current reaches a steady-state, no current flows and the RC product of the circuit 110 can approach infinity, resulting in a very effective filter.

In use, an input voltage can be supplied at the high voltage input 112 and current will flow toward ground 132. If the input voltage is a positive voltage, the current can pass across the first diode 120 and charge the capacitor 130 to provide an output voltage at the high voltage output 114. The positive voltage current can be blocked by the second diode 122. If the input voltage is a negative voltage, the current can pass across the second diode 122 and charge the capacitor 130 to provide an output voltage at the high voltage output 114. The negative voltage current can be blocked by the first diode 120. An input voltage at the high voltage input 112 can be in the range of about ±2 kV to about ±8 kV, and the resulting output voltage at the high voltage output 114 can be nearly identical. In some embodiments, a second control loop (not shown) can be added to the circuit 110 to allow the voltage output to at the high voltage output 114 to be adjusted as desired.

The output voltage can be applied to a number of components, but in some embodiments, the output voltage can be applied to one or more lens elements disposed between a mass analyzer and an ion analyzer, or within the ion analyzer itself. The benefit of using the teachings related to a filter comprising a diode with lens elements is that there is no resistive load connected to the one or more lens elements.

Figure 3:
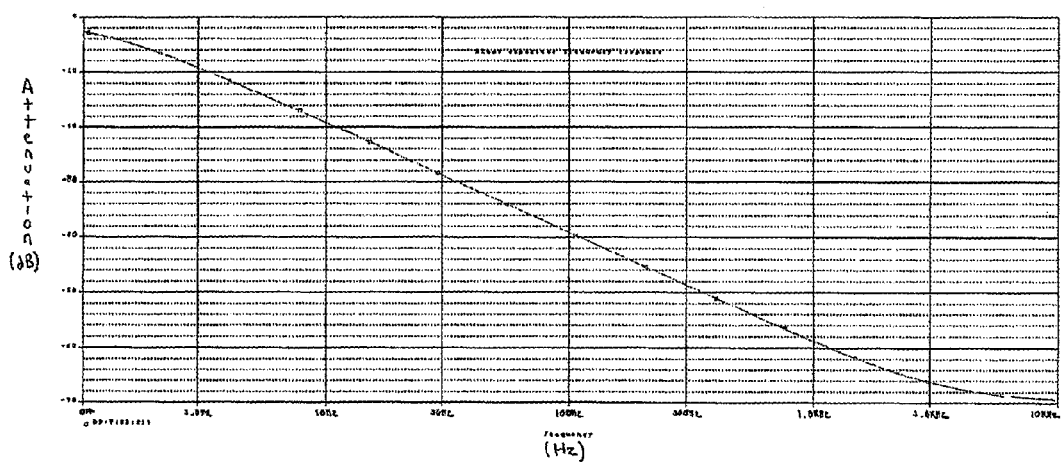
FIG. 3 presents a plot of the attenuation as it relates to frequency for the circuit of FIG. 2.

Aspects of the applicants' teachings may be further understood in light of the following example, which should not be construed as limiting the scope of the applicants' teachings in any way. FIG. 3 illustrates a simulation of the circuit 110 of FIG. 2 using Cadence® Pspice®. As illustrated, as the frequency of the system increases (X-axis), the removal of noise or attenuation (Y-axis) continues to increase in a near linear fashion. At about 10 Hz, the attenuation can be about 20 dB, indicating that the noise components of the circuit 110 at 10 Hz can be reduced by a factor of about 10. By way of non-limiting example, greater filtering can be achieved by increasing the capacitance value of the capacitor 130, which in turn can result in the curve of FIG. 2 shifting to the left. The circuit of FIG. 2 was also tested on the bench, demonstrating results similar to those illustrated in FIG. 3 at low direct current (DC) voltages. Still further, the circuit of FIG. 2 was installed on a prototype TOF spectrometer and tested. The tests demonstrated a significant increase in resolution, on the order of about 25 percent. A person skilled in the art will recognize that mass spectrometers incorporating applicants' teachings but having different overall designs can produce varying improved results.

Figure 4:
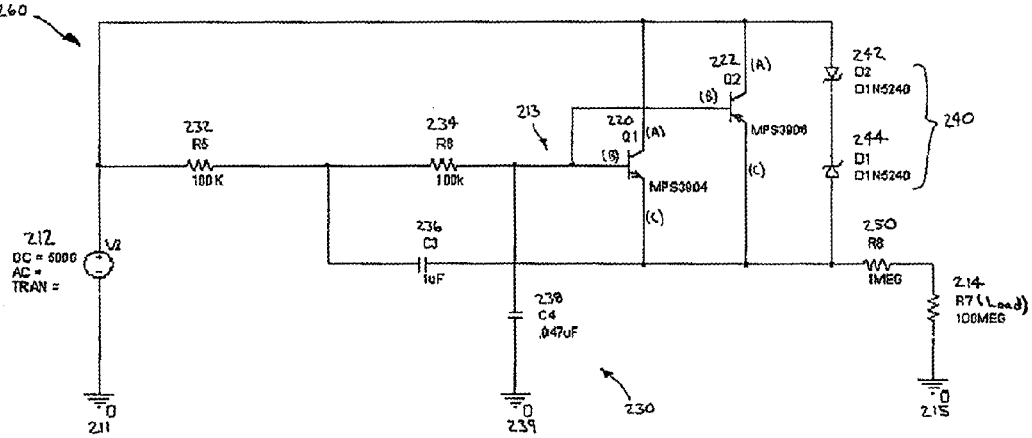
FIG. 4 is a schematic representation of a circuit according to some embodiments of the applicants' teachings.

FIG. 4 illustrates another filter or circuit 210 according to some embodiments of the applicants' teachings. The filter 210 can comprise one or more transistors, as shown two transistors 220 and 222, which can help filter noise from a high voltage input 212 before voltage supplied by the input 212 reaches a high voltage output or load, illustrated as load resistor 214. Although the output or load is illustrated as a load resistor 214, other electrical components can be used as the output for the circuit 210. As shown, the input 212 and the load resistor 214 can be grounded, respectively at grounds 211, 215 in the illustrated embodiment. The one or more transistors 220, 222 can also help maintain a substantially constant voltage to the load resistor 214. As shown, in some embodiments, the one or more transistors 220, 222 can be emitter follower transistors, which can have current gain, unity voltage gain, and power gain (which can be the product of the current and voltage gains).

Figure 6:
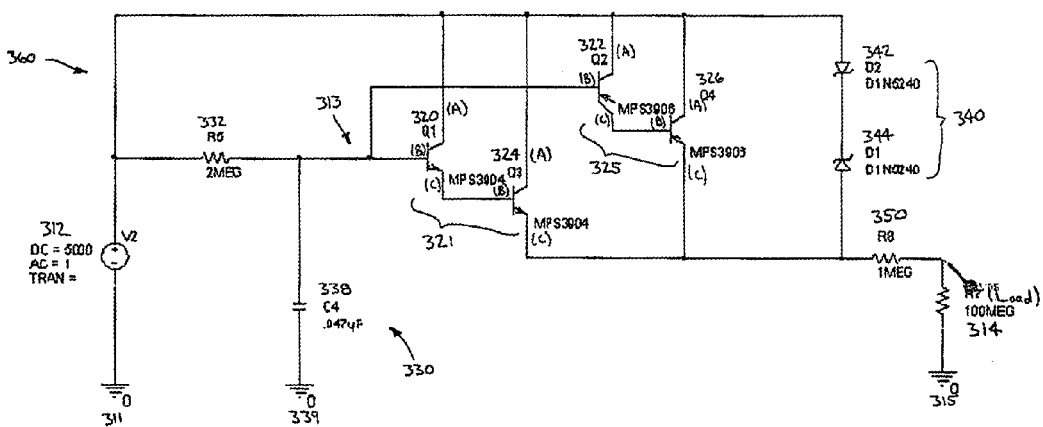
FIG. 6 is a schematic representation of a circuit according to some embodiments of the applicants' teachings.

The one or more transistors 220, 222 can be wired in a variety of ways, but in some embodiments collector leads (A) of the transistors 220 can be electrically connected to the high voltage input 212 and base leads (B) of the transistors 220, 222 can be electrically connected to a filtered high voltage output 213. The voltage at the collector lead (A) can be configured to bias the transistors 220, 222, while the voltage at the base lead (B) can be fed across the transistors 220, 222 and outputted to transistor emitters (C). In various embodiments, two transistors 220, 222 can be used, which can allow currents from voltages of opposite polarity to flow through the filter 210. In the illustrated embodiment, the first transistor 220 is an npn transistor, more specifically MPS3904, and the second transistor 222 is a pnp transistor, more specifically MPS3906, although a number of other transistors can be used depending, at least in part, on the other components of the circuit and the desired input and output parameters. Further, in some embodiments, set-ups incorporating Darlington transistors 321, 325, as illustrated in FIG. 6 and discussed below, can be used in conjunction with and/or in place of components of the circuit 210.

In some embodiments, the circuit 210 can further comprise a low pass filter 230 electrically coupled with the one or more transistors 220, 222 to allow low frequencies through but block high frequencies. Many different types of low pass filters 230 can be used, for example a single low pass filter comprising a resistor and a capacitor (such as the low pass filter illustrated in FIG. 6 as discussed below, or the one or more diodes 120, 122 and the capacitor 130 of the circuit 110, as discussed above), but in some embodiments, like the circuit illustrated in FIG. 4, the low pass filter 230 can comprise a second order low pass filter. In some embodiments, the second order low pass filter can comprise two resistors 232, 234 and two capacitors 236, 238. As shown, in some embodiments, the first resistor 232 and the second resistor 234 can be coupled in series with the second capacitor 238, the second capacitor 238 can also be coupled to ground 239 on one side while being coupled to base leads (B) of the transistors 220, 222 on the other. The first capacitor 236 can be coupled in series with the first resistor 232 across the base lead (B) and the transistor emitters (C) of the transistors 220, 222. The second order low pass filter can provide additional signal filtering, thereby reducing the noise in the system. Although any number of resistance values and any number of capacitance values can be used with the resistors 232, 234 and capacitors 236, 238 of the low pass filter 230, depending, at least in part, on the other components of the circuit and the desired input and output parameters, in some embodiments a resistance of the first resistor 232 can be in the range of about 10 kΩ to about 500 kΩ a resistance of the second resistor 234 can be in the range of about 10 kΩ to about 500 kΩ, a capacitance of the first capacitor 236 can be in the range of about 0.1 µF to about 10 µF, and a capacitance of the second capacitor 238 can be in the range of about 0.001 µF to about 0.1 µF. In the illustrated embodiment, the first and second resistors 232, 234 have resistances of about 100 kΩ, the first capacitor 236 has a capacitance of about 1 µF, and the second capacitor 238 has a capacitance of about 0.047 µF.

In some embodiments, the circuit can further comprise a Zener diode pair 240. As shown, the Zener diode pair 240 can comprise a first diode 242 and a second diode 244 in opposite directions and electrically coupled in parallel with the first and second transistors 220, 222. The Zener diode pair 240 can protect the circuit 210 from high voltage transients that can result in use. As shown, the first and second diodes 242, 244 are D1N5240 diodes, although a number of other diodes can be used depending, at least in part, on the other components of the circuit and the desired input and output parameters.

In some embodiments, the circuit 210 can further comprise one or more resistors coupled to the output of the second capacitor 238 and the transistors 220, 222 in series. Any number of resistors can be used, but in the illustrated embodiment a first resistor 250 is included as part of the circuit 210, upstream to the previously discussed load resistor 214. The one or more resistors 250 can help protect the circuit 210 from excessive current in the event of a short circuit. Although the resistance values of any resistors can vary depending, at least in part, on the other components of the circuit and the desired input and output parameters, in some embodiments the resistance of any one of the one or more resistors can be in the range of about 0.1 MΩ to about 1000 MΩ. In the illustrated embodiment, the resistance of the first resistor 250 is about 1 MΩ and the resistance of the load resistor 214 is about 100 MΩ.

In use, an input voltage can be supplied at the high voltage input 212 to drive the load resistor 214. The input voltage can be connected directly to both the low pass filter 230 and the collector leads (A) of the one or more transistors 220, 222. The voltage that passes through the low pass filter 230 can be filtered so that frequencies above a particular threshold level can be prevented from reaching the remainder of the circuit 210. While the choice as to what frequencies can pass through the circuit 210 can be set based on a number of different parameters, in some embodiments, a threshold frequency can be in the range of about 1 Hz to about 100 Hz. Voltages that do pass across the low pass filter 230 can then be fed into the base leads (B) of the transistors 220, 222. The voltage directed toward an upper portion 260 of the circuit 210 can be applied to the transistors 220, 222 at the collector leads (A), which can be configured to bias the transistors 220, 222.

The filtered voltage that arrives at the base leads (B) can drive current flow across one of the two transistors 220, 222, depending on whether the voltage is positive or negative. For instance, as shown, when a negative voltage is applied, the first transistor 220 can be configured to turn off such that no current passes across it while the second transistor 222 allows current to pass. There may be a small voltage drop as the current moves from the base lead (B) to the transistor emitter (C). Likewise, when a positive voltage is applied, the second transistor 222 can be configured to turn off such that no current passes across it while the first transistor 220 passes current across it, again with the possibility of a small voltage drop that can occur as the current moves from the base lead (B) to the transistor emitter (C).

If the value of the voltage across the upper portion 260 of the filter 210 exceeds a certain level, which can happen, for example, if the load resistor 214 becomes shorted, then the current can bypass both transistors 220, 222 and can instead be conducted by the Zener diode pair 240. In some embodiments, the voltage at which the Zener diode pair 240 can begin conducting in the range of about ±10 V to about ±30 V.

Figure 5:
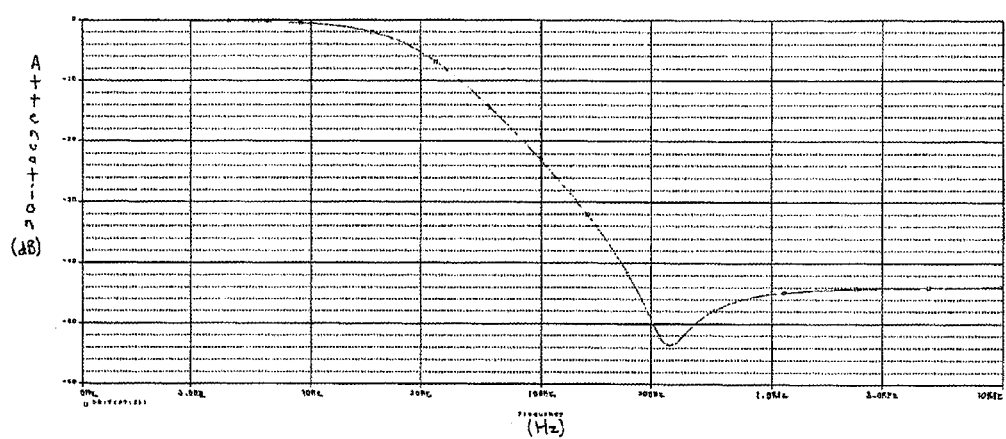
FIG. 5 presents a plot of the attenuation as it relates to frequency for the circuit of FIG. 4.

After a current has passed across the respective transistor 220, 222, the current can then move across the one or more resistors 250, if present, and to the voltage output, i.e., as shown the load resistor 214. Generally, the circuit 210 can have a unity gain at DC. The alternating current (AC) gain can decrease with frequency, and a non-limiting, typical response of such a gain is illustrated in FIG. 5.

An input voltage at the high voltage input 212 can be in the range of about ±2 kV to about ±8 kV, and the resulting output voltage at the load resistor 214 can be approximately 0.6 V lower. The exact value of the load resistor 214 can be more controlled, for example, by adding a feedback loop that can adjust the high voltage supply 212 to obtain the desired output voltage. In the illustrated embodiment the input voltage is about ±5 kV and the resulting output voltage is about ±4.9994 kV.

Aspects of the applicants' teachings may be further understood in light of the following example, which should not be construed as limiting the scope of the applicants' teachings in any way. FIG. 5 illustrates a simulation of the circuit 210 of FIG. 4 using Cadence® Pspice®. Similar to FIG. 3, the frequency of the system is illustrated on the X-axis and the removal of noise or attenuation is illustrated on the Y-axis. The plot illustrates that the filter removes noise only at higher frequencies. As shown, attenuation is minimal until the frequency moves past about 3.0 Hz, before the attenuation begins to increase significantly at about 20 Hz. The attenuation continues until after about 350 Hz, at which point no further increase of attenuation occurs, and in fact some of the attenuation is lost. This can be due to the realities of a system in which saturation eventually prevents further attenuation. The maximum attenuation shown in the simulation is about 54 dB. The parameters achieved by this system can be adjustable based on the various components used in creating the circuit 210, and thus attenuations of lesser or greater values, and/or more quickly or slowly, can be achieved. For example, in some embodiments, attenuation in the range of about 10 dB to about 45 dB for frequencies in the range of about 50 Hz to about 10 kHz can be achieved. The circuit 210 of FIG. 4 was also tested on the bench, demonstrating results similar to those illustrated in FIG. 5.

FIG. 6 illustrates another filter or circuit 310 according to some embodiments of the applicants' teachings. The filter 310 can comprise one or more transistors, as shown four transistors 320, 322, 324, 326, which can help filter noise from a high voltage input 312 before voltage supplied by the input 312 reaches a high voltage output or load, illustrated as load resistor 314. Similar to the circuit 210 of FIG. 4, although the output or load is illustrated as a load resistor 314, other electrical components can be used as the output for the circuit 310. As shown, the input 312 and the load resistor 314 can be grounded, respectively at grounds 311, 315 in the illustrated embodiment. The one or more transistors 320, 322, 324, 326 can also help maintain a substantially constant voltage across the load resistor 314. As shown, the one or more transistors comprise two pairs of transistors 321, 325. The first pair of transistors 321 comprises the first transistor 320 and the third transistor 324 that together form a Darlington transistor, and the second pair of transistors 325 comprises a second transistor 322 and a fourth transistor 326 that together form a Darlington transistor, but in the opposite direction. Darlington transistors can improve the ability of the circuit 310 to handle high voltages or currents, and can also provide high impedances as desired, by increasing the beta or current gain of the circuit 310. Thus, a small current in base leads (B) of first transistors of the Darlington transistors 321, 325, i.e., the first and second transistors 320, 322, can control a large current in collector leads (C) of the transistors 320, 322, 324, 326, and the effective capacitor value can be improved as the beta of the transistors 320, 322, 324, 326 increases.

In some embodiments, the first, second, third, and fourth transistors 320, 322, 324, 326 can be emitter follower transistors, which can have current gain, unity voltage gain, and power gain (which can be the product of the current and voltage gains). While the first and second transistor pairs 321, 325 can be wired in a variety of ways, in some embodiments collector leads (A) of the transistors 320, 322, 324, 326 can be electrically connected to the high voltage input 312, base leads (B) of the first and second transistors 320, 322 can be electrically connected to a filtered high voltage input 313, and base leads (B) of the third and fourth transistors 324, 326 can be electrically connected to a transistor emitter (C) of the respective first and second transistors 320, 322. The voltage at the collector leads (A) can be configured to bias the four transistors 320, 322, 324, 326, while the voltage at the base lead (B) can be fed across the transistors 320, 322, 324, 326 and outputted by way of the respective transistor emitter (C). In the illustrated embodiment, the first and third transistors 320, 324 are npn transistors, more specifically MPS3904s, and the second and fourth transistors 322, 326 are pnp transistors, more specifically MPS3906s, although a number of other transistors can be used depending, at least in part, on the other components of the circuit and the desired input and output parameters.

Although the illustrated embodiment shows two transistor pairs 321, 325, in some other embodiments the one or more transistors can be a single transistor pair or Darlington transistor operating at one polarity. Further, in some other embodiments, additional stages can be added to the transistor pairs or Darlington transistors such that transistor pairs or Darlington transistors can comprise three or more transistors. Accordingly, use of the word "pair" herein for transistors, or any other components of the systems, devices, circuits, and methods, does not limit the number of transistors or other components to two transistors or other components. A pair can include two or more transistors or two or more other such components. Increasing the number of transistors in the Darlington transistors can increase the beta of the pair. Further, in some embodiments, transistor set-ups like the ones discussed with respect to the circuit 210 can be used in conjunction with and/or in place of components of the circuit 310.

In some embodiments, the circuit 310 can further comprise a low pass filter 330 electrically coupled with the one or more transistors 320, 322, 324, 326 to allow low frequencies through but block high frequencies. While many different types of low pass filters 330 can be used, including a second order low pass filter like that of FIG. 4, in some embodiments a single low pass filter comprising a resistor 332 and a capacitor 338 can be used. In some embodiments, resistors, such as the resistor 332, can be replaced with one or more diodes, for example, the diodes shown and described with respect to FIG. 1, which can also provide desired filtering. The resistor and capacitor 332, 338 can be coupled in series. As shown, in some embodiments, the resistor 332 can be coupled to the voltage input 312 and the capacitor 330, and the capacitor can be coupled to ground 339 on one side while being coupled to the base leads (B) of the first and second transistors 320, 322 on the other.

Although any number of resistance values and any number of capacitance values can be used with the resistor 332 and capacitor 338, depending, at least in part, on the other components of the circuit and the desired input and output parameters, in some embodiments a resistance of the resistor 332 can be in the range of about 0.1 MΩ to about 10 MΩ and a capacitance of the capacitor 338 can be in the range of about 0.001 µF to about 0.1 µF. In the illustrated embodiment, the resistor 332 has a resistance of about 2 MΩ and the capacitor 338 has a capacitance of about 0.047 µF.

In some embodiments, the circuit 310 can further comprise a Zener diode pair 340. As shown, the Zener diode pair 340 can comprise a first diode 342 and a second diode 344 in opposite directions and electrically coupled in parallel with the first and second transistor pairs 321, 325. The Zener diode pair 340 can protect the circuit 310 from high voltage transients that can result in use. As shown, the first and second diodes 342, 344 are D1N5240 diodes, although a number of other diodes can be used depending, at least in part, on the other components of the circuit and the desired input and output parameters.

In some embodiments, the circuit 310 can further comprise one or more resistors coupled to the output of the transistors 320, 322, 324, 326. Any number of resistors can be used, but in the illustrated embodiment a first resistor 350 is included as part of the circuit 310, upstream to the previously discussed load resistor 314. The one or more resistors 350 can help protect the circuit 310 from excessive current in the event of a short circuit. Although the resistance values of any resistors can vary depending, at least in part, on the other components of the circuit and the desired input and output parameters, in some embodiments the resistance of any one of the one or more resistors can be in the range of about 0.1 MΩ to about 1000 MΩ. In the illustrated embodiment, the resistance of the first resistor 350 is about 1 MΩ and the resistance of the load resistor 314 is about 100 MΩ.

In use, an input voltage can be supplied at the high voltage input 312 to drive the load resistor 314. The input voltage can be connected directly to both the low pass filter 330 and the collector leads (A) of the one or more transistor pairs 321, 325. The voltage that passes through the low pass filter 330 can be filtered so that frequencies above a particular threshold level can be prevented from reaching the remainder of the circuit 310. While the choice as to what frequencies can pass through the circuit 310 can be set based on a number of different parameters, in some embodiments, a threshold frequency can be in the range of about 1 Hz to about 100 Hz. Voltages that do pass across the low pass filter 330 can then be fed into the base leads (B) of the initial transistors 320, 322 of each transistor pair 321, 325. The voltage directed toward an upper portion 360 of the circuit 310 can be applied to each of the transistors 320, 322, 324, 326 at the collector leads (A), which can be configured to bias the transistors 320, 322, 324, 326.

The filtered voltage that arrives at the base leads (B) of the first transistor 320 and the second transistor 322 can drive current flow across one of the two transistors 320, 322, depending on whether the voltage is positive or negative. For instance, as shown, when a negative voltage is applied, the first transistor 320, and thus the third transistor 324, can be configured to turn off such that no current passes across them while the second transistor 322, and then the fourth transistor 326, allows current to pass. There may be a small voltage drop as the current moves from the base lead (B) of the second transistor 322 to the transistor emitter (C) of the second transmitter 322, and then again from the base lead (B) of the fourth transistor 326 to the transistor emitter (C) of the fourth transmitter 326. Likewise, when a positive voltage is applied, the second transistor 322, and thus the fourth transistor 326, can be configured to turn off such that no current passes across them while the first transistor 320 passes the current it, and then across the third transistor 324, again with the possibility of a small voltage drop that can occur both as the current moves from the base lead (B) of the first transistor 320 to the transistor emitter (C) of the first transmitter 320, and from the base lead (B) of the third transistor 324 to the transistor emitter (C) of the third transistor 324.

If the value of the voltage across the upper portion 360 of the filter 310 exceeds a certain level, which can happen, for example, if the load resistor 314 becomes shorted, then the current can bypass both transistor pairs 321, 325 and can instead be conducted by the Zener diode pair 340. In some embodiments, the voltage at which the Zener diode pair 340 can begin conducting in the range of about ±10 V to about ±30 V.

After a current has passed across the respective transistor pair 321, 325, the current can then move across the one or more resistors 350, if present, and to the voltage output, i.e., as shown the load resistor 314. Generally, the circuit 310 can have a unity gain at DC. The gain can decrease with frequency, which can provide desired filtering.

An input voltage at the high voltage input 312 can be in the range of about ±2 kV to about ±8 kV, and the resulting output voltage at the load resistor 314 can be approximately 1.2 V smaller in magnitude. The exact voltage of the load resistor 314 can be controlled, for example, by adding a feedback loop that can adjust the high voltage supply 312 to obtain the desired output voltage. In the illustrated embodiment the input voltage is about ±5 kV and the resulting output voltage is about ±4.9988 kV.

Figure 7:
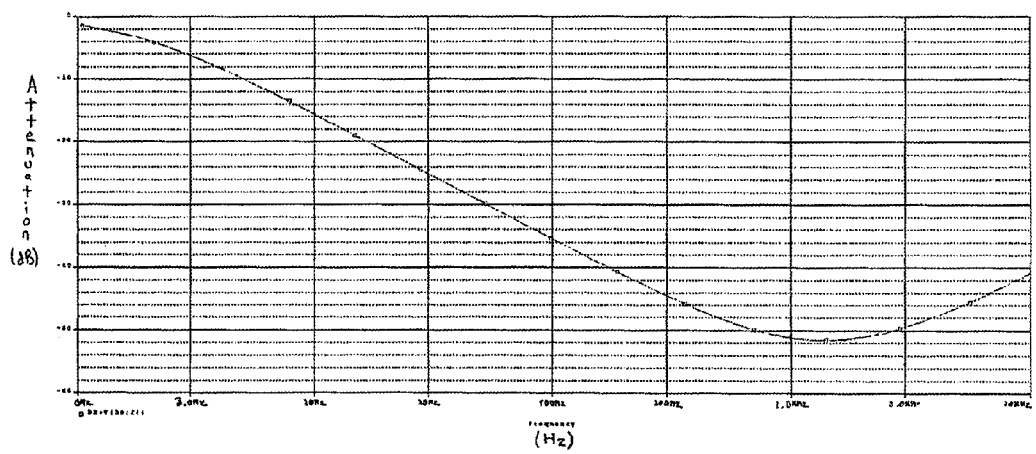
FIG. 7 presents a plot of the attenuation as it relates to frequency for the circuit of FIG. 6.

Aspects of the applicants' teachings may be further understood in light of the following example, which should not be construed as limiting the scope of the applicants' teachings in any way. FIG. 7 illustrates a simulation of the circuit 310 of FIG. 6 using Cadence® Pspice®. Similar to FIGS. 3 and 5, the frequency of the system is illustrated on the X-axis and the removal of noise or attenuation is illustrated on the Y-axis. The plot illustrates that the filter begins removing noise almost immediately, and doing so in a near linear fashion between about 3 Hz and about 400 Hz. At about 20 Hz, the attenuation is about 20 dB. The system continues to attenuate until about 1.8 kHz, at which point no further attenuation occurs, and in fact some of the attenuation is lost. This can be due to the realities of a system in which saturation eventually prevents further attenuation. The maximum attenuation shown in the simulation is about 52 dB. The parameters achieved by this system can be adjustable based on the various components used in creating the circuit, and thus attenuations of lesser or greater values, and/or more quickly or slowly, can be achieved. For example, in some embodiments, attenuation in the range of about 10 dB to about 40 dB for frequencies in the range of about 5 Hz to about 10 kHz can be achieved. This circuit 310 was also tested on the bench and on a prototype TOF spectrometer, and the results of such tests were similar to the simulation shown in FIG. 7.

Figure 8:
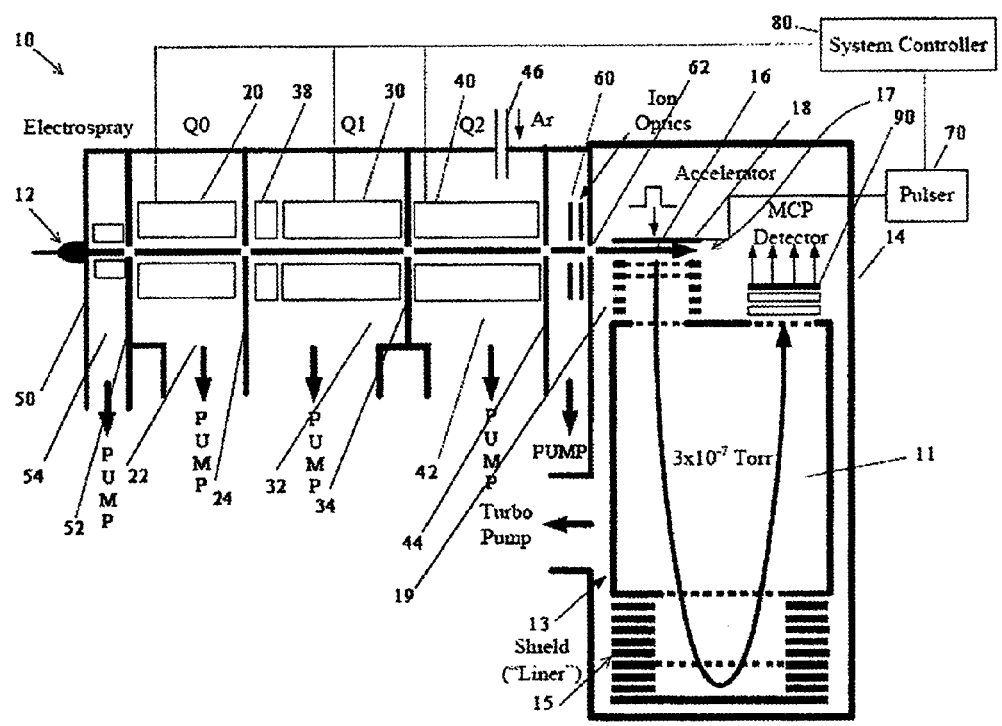
FIG. 8 is a schematic representation of a mass spectrometer in accordance with some embodiments of the applicants' teachings.

The systems, devices, circuits, and methods described herein can be used in conjunction with many different mass spectrometry systems. While FIG. 1 provides a general framework of some mass spectrometers with which applicants' teachings can be used, FIG. 8 provides some further details of some such spectrometers. Aspects of the applicants' teachings may be further understood in light of the example associated with FIG. 8, but such embodiments should not be construed as limiting the scope of the applicants' teachings in any way. A person skilled in the art will understand a variety of configurations in which mass spectrometers, as well as components thereof, e.g., mass analyzers and ion analyzers, can be used in accordance with applicants' teachings.

FIG. 8 illustrates one non-limiting embodiment of a time-of-flight mass spectrometer 10, and more particularly a hybrid quadrupole/time-of-flight mass spectrometer (QqTOF), which was previously illustrated more generically in FIG. 1. As shown, the mass spectrometer 10 can comprise an ion source 12, an ion analyzer 14, and a mass analyzer 9 that comprises one or more quadrupoles 20, 30, 40, located upstream of the analyzer 14. The quadrupoles 20, 30, 40, can be disposed in adjacent chambers 22, 32, 42 that can be separated, for example, by lenses 24, 34.

Applicants' teachings related to circuits or filters for use with high voltage power supplies can be used with any power supply of the mass spectrometer 10 that provides a high voltage, which, by way of non-limiting example, can be any voltage over about ±30 V, and in some embodiments applicants' teachings are particularly useful in conjunction with the analyzer 14, which comprises a TOF analyzer comprising an ion detection module and one or more MCP detectors 90.

Analyte ions, which can include both product and precursor ions (discussed below), can be transmitted into the analyzer 14 through one or more ion optical elements or lenses 60 and an ion inlet 62. The one or more lenses 60 can be coupled to a high voltage power supply that supplies voltages in a range of about ±2 kV to about ±8 kV. Once through the inlet 62, ions can be collected in an accumulation/acceleration region 16 of an accelerator or accelerator assembly 17 within the analyzer 14. The accelerator assembly can be powered by a high voltage to accelerate the ions, for instance a voltage in the range of about ±500 V to about ±2 kV. In various embodiments, the accumulation/acceleration region 16 can contain a push electrode 18 for directing ions toward a field-drift chamber 11. In some embodiments, the accelerator assembly 17 can also comprise additional electrodes, such as, by way of non-limiting example, guard rings 19. In various embodiments the guard rings 19 can form an acceleration column for accelerating ions prior to the field-drift chamber 11. Ion accumulation can be stopped and ions can be accelerated into a field-drift chamber 11 by application of a short, high voltage electric field to the electrode 18 and the electrodes 19 during an acceleration time interval. The applied voltage can be in the range of about ±500 V to about ±2 kV. In some embodiments, as shown in FIG. 8, the high voltage can be supplied by a pulser 70 coupled to the electrodes 18 and guard rings 19.

In various embodiments the field-drift chamber 11 can comprise a shield or liner 13. A high voltage can be applied to the liner 13 to create an electric field in which the ions drift. The applied voltage can be in the range of about ±2 kV to about ±20 kV. Optionally, one or more ion reflectors or mirrors 15 can also be included to increase the effective length of the flight path as shown in FIG. 8. In some embodiments, an ion reflector 15 can comprise a two-stage ion mirror. The applied voltage of the one or more ion reflectors 15 can be in the range of about ±0 V to about ±5 kV.

After passing through the field-drift chamber 11, the ions can be received by one or more MCP detectors 90 for detection. It will be understood that the ion source can be a pulsed or continuous flow ion source, but that in either case ions can be accelerated into the field-drift chamber 11 as separate batches (or extractions) of ions. Similar to the other components, a voltage can be applied to the one or more MCP detectors 90, for example in the range of about ±2 kV to about ±20 kV. The one or more MCP detectors 90 can be used to measure a number of parameters. In some embodiments, the parameter can be a length of time it takes the ions to pass across the field-drift chamber 11, i.e., the time it takes to complete a flight path, which can be indicative of the m/z ratio of the ions. Typically, ions having larger m/z ratios take longer to complete a flight path than ions having smaller m/z ratios.

The pulser 70 can be configured to provide voltage to any number of components of the system. The applied voltages can be high voltages, in the range of about ±2 kV to about ±20,000 kV. As shown, in some embodiments the pulser 70 can be electrically coupled to the accelerator assembly 17, and more particularly to the push electrode 18 and the guard rings 19, however, in some embodiments the pulser 70 can be electrically coupled to one or more of any of the components of the mass spectrometer 10, including but not limited to the lenses 60, accelerator assembly 17, liner 13, reflectors 15, and one or more MCP detectors 90, such that the voltage input for any of these components is provided by the pulser 70. The pulser 70 can include one or more switches to turn on and off the power to one or more components of the mass spectrometer 10 at a time. Accordingly, applicants' teachings pertaining to various filters or circuits can be incorporated into the circuitry of the pulser 70 and/or the circuitry of any one of the components receiving a voltage input from the pulser 70 or any other voltage supply.

In various embodiments the mass spectrometer 10 can comprise a system controller 80, which can comprise any suitable software, hardware, and firmware. In some embodiments, an application program can be used to operate and control the system controller 80. In various embodiments the system controller 80 can control various aspects of the mass spectrometer 10. For example, the system controller 80 can control high voltages supplied by the pulser 70. Specifically, in some embodiments, the system controller 80 can control the on-off operation of the switches of the pulser 70. In various embodiments the system controller 80 can control the pulse rate of the voltage applied to the various electrodes 18, 19 of the acceleration assembly 17. In some embodiments, the system controller 80 can also control other components of the mass spectrometer 10, including but not limited to one or more of the quadrupoles 20, 30, 40. Further, in some embodiments, the system controller 80 can control the pulser 70 according to one or more properties of the sample ions or analyte ions selected for analysis. Still further, in some embodiments, the system controller 80 can control the pulser 70 according to the mass of the analyte ions that have been selected for mass analysis. Still further, in some embodiments, the system controller 80 can control the pulser 70 according to the m/z ratio of the analyte ions that have been selected for mass analysis. In various embodiments an application program can determine how the pulser 70 can be controlled. In some embodiments, different application programs can be selected based on a variety of factors, including but not limited to the type of sample.

Analyte ions that arrive at the lenses 62 for analysis and detection in the analyzer 14 can be selected using a variety of systems, devices, and methods. As shown in FIG. 8, ions can initially be provided by an ion source 12, for instance an electrospray source. Other non-limiting examples of an ion source comprise a continuous ion source, a pulsed ion source, an inductively coupled plasma (ICP) ion source, a matrix-assisted laser desorption/ionization (MALDI) ion source, a glow discharge ion source, an electron impact ion source, or a pho-ionization ion source, among others.

Once emitted from the ion source 12, ions can optionally be extracted into a coherent ion beam by passing successively through apertures in a sampler plate 50 and a skimming plate ("skimmer") 52, which can be housed in a vacuum chamber 54 configured to be evacuated by a mechanical pump to achieve desired pressures. The ion extraction provided by the sampler plate 50 and skimmer 52 can result in a narrow and highly focused ion beam. In some embodiments, additional vacuum chambers, plates, skimmers, and pumps can be utilized, for example, to provide additional focusing of and finer control over the ion beam.

Ions emitted from the ion source 12, whether they pass through one or more sampler plates or skimmers, can pass through one or more quadrupoles. The one or more quadrupoles can be situated in one or more chambers associated with one or mechanical pumps such that the pumps can be operable to evacuate the one or more chambers to desired pressure ranges. Typically, the pressure within each chamber increases with each successive quadrupole. Although the illustrated embodiment uses quadrupoles, hexapoles, octapoles, or other poles of this nature can also be used.

As shown, ions emitted from the ion source 12 can pass through the quadrupoles 20, 30, 40, each of which can be disposed in a chamber 22, 32, 42, respectively, with each chamber being separated by a respective lens 24, 34. The quadrupoles 20, 30, 40 can be configured to perform a variety of functions for a variety of purposes, depending on, at least, the mass being analyzed and the desired parameters being measured. Thus, any description of how a particular quadrupole is used in conjunction with the described embodiments in no way limits the use of applicants' teachings with any number of quadrupoles performing any number of functions.

In some embodiments, the Q0 quadrupole 20 can be configured for operation as a collimating quadrupole to provide for collisional cooling and focusing of the ions. In some embodiments, the Q1 quadrupole 30 can be configured to select ions of interest, sometimes referred to as precursor ions. By way of non-limiting examples, the Q1 quadrupole 30 can be operated in a mass-resolving mode to select ions having particular m/z ratios as precursor ions, or alternatively, the Q1 quadrupole 30 can be operated as an ion trap by maintaining the lens 34 at a much higher offset potential than the Q1 quadrupole 30. In some embodiments, the Q2 quadrupole 40 can be configured to operate as a collision cell to select ions to be measured in the analyzer 14. By way of non-limiting example, the ions in the Q2 quadrupole 40 can be subjected to collision-induced dissociation (CID) by supplying a suitable collision gas (e.g., argon, helium, etc.) through a gas inlet 46 to further focus the ions and provide product ions. Alternatively, the Q2 quadrupole 40 can be operated as an ion trap. Ions ejected from the Q2 quadrupole 40 can then pass through the one or more lenses 60 and into the analyzer 14 for detection as described above.

Optionally, one or more RF-only ion guides or stubby rods can be included to facilitate the transfer of ions between quadrupoles. The stubby rods can serve as a Brubaker lens and can help prevent ions from undergoing orbital decay due to interactions with any fringing fields that may have formed in the vicinity of the adjacent lens, for example, if the lens is maintained at an offset potential. While stubby rods can be located in a number of locations throughout the mass analyzer 9, as shown stubby RF-only ion guides or stubby rods 38 are provided between the Q0 quadrupole 20 and the Q1 quadrupole 30, disposed in the chamber 32.

Although the quadrupoles 20, 30, 40 and their associated components have been described having configurations and modes designed to achieve a particular purpose, a person skilled in the art will recognize that each of the quadrupoles 20, 30, 40 can also have other configurations and be operated in other modes depending, at least in part, on the desired mass spectrometer application.

Further, it will be understood that the mass spectrometer 10 described herein is but one possible TOF topology that can be used according to aspects of the systems, devices, circuits, and methods disclosed herein. Other non-limiting, exemplary embodiments of mass spectrometers that can be used in conjunction with the systems, devices, circuits, and methods disclosed herein comprise single-stage or stand-alone time-of-flight mass spectrometers (TOF), dual-stage or tandem time-of-flight mass spectrometers (TOF-TOF), hybrid trap/time-of-flight mass spectrometers (Trap-TOF), and mass spectrometers having other time-of-flight topologies. Some non-limiting examples of other embodiments of mass spectrometers, or components thereof that can be used in association with applicants' teachings can be found in U.S. Patent Application Ser. No. 61/332,387 and its subsequent related PCT Publication WO 2011/138669, entitled "Triple Switch Topology for Delivering Ultrafast Pulser Polarity Switching for Mass Spectrometry," filed May 7, 2010 and May 6, 2011, respectively, and which are hereby incorporated by references in their entireties.

Still further, it will be understood that the applicants' teachings can also be applied to mass spectrometers and analyzers having other configurations that comprise the application of high voltage having noise effects. By way of non-limiting examples, an analyzer that comprises an electron multiplier, for instance a discrete dynode electron multiplier or a continuous dynode electron multiplier, can also be used in conjunction with applicants' teachings. Some non-limiting examples of other embodiments of mass spectrometers, or components thereof that can be used in association with applicants' teachings can be found in U.S. Pat. No. 7,923,681, entitled "Collision Cell for Mass Spectrometer," which is hereby incorporated by reference in its entirety.

While the above description provides examples and specific details of various embodiments, it will be appreciated that some features and/or functions of the described embodiments admit to modification without departing from the scope of the described embodiments. The above description is intended to be illustrative of the invention, the scope of which is limited only by the language of the claims appended hereto. For example, while the teachings herein are described in conjunction with various embodiments, it is not intended that such teachings be limited to such embodiments. On the contrary, the teachings herein encompass various alternatives, modifications, and equivalents, as will be appreciated by those of skill in the art. All publications and references cited herein are expressly incorporated herein by reference in their entirety.

The invention claimed is:

1. A circuit for use with a high voltage power supply of a mass spectrometer system, comprising:
   a high voltage input;
   a high voltage output;
   a low pass filter coupled between the high voltage input and the high voltage output and configured to prevent frequencies higher than a threshold frequency from passing to the high voltage output; and at least two transistors coupled between the high voltage input and the high voltage output, the at least two transistors being electrically coupled in parallel and each comprising an emitter follower transistor and wherein the at least two transistors are positioned downstream of the low pass filter and configured to filter noise from a voltage outputted by the high voltage input before the voltage arrives at the high voltage output; and wherein a collector lead of each of the at least two transistors is electrically connected to the high voltage input and a base lead of each of the at least two transistors is electrically connected to the low pass filter.

2. The circuit of claim 1 wherein a first transistor of the at least two transistors comprises an npn transistor and a second transistor of the at least two transistors comprises a pnp transistor.

3. The circuit of claim 1, wherein the at least two transistors comprises at least two transistor pairs electrically coupled in parallel, each pair comprising a Darlington transistor.

4. The circuit of claim 1, wherein the low pass filter comprises at least one resistor and at least one capacitor.

5. The circuit of claim 1, further comprising a Zener diode pair electrically coupled in parallel with the at least two transistors.

6. The circuit of claim 1, further comprising a resistor disposed downstream of the at least two transistors.

7. The circuit of claim 1, wherein the high voltage input is the only power supply associated with the circuit.

8. The circuit of claim 1, wherein the high voltage output is applied to at least one of a lens, an accelerator, an electrode, a liner, a reflector, and one or more multi-channel plate detectors.

9. The circuit of claim 3 wherein a first transistor pair of the at least two transistor pairs comprises at least two npn transistors and a second transistor pair of the at least two transistor pairs comprises at least two pnp transistors.

10. The circuit of claim 4 wherein the low pass filter comprises a second order low pass filter such that the at least one resistor comprises at least two resistors and the at least one capacitor comprises at least two capacitors.

* * * * *